United States Patent [19]

Chua

[11] Patent Number: 4,891,683

[45] Date of Patent: Jan. 2, 1990

[54] INTEGRATED SCR CURRENT SOURCING SINKING DEVICE

[75] Inventor: Hua-Thye Chua, Cupertino, Calif.

[73] Assignee: Advanced Micro Devices, Inc., Sunnyvale, Calif.

[21] Appl. No.: 193,232

[22] Filed: May 11, 1988

Related U.S. Application Data

[60] Continuation of Ser. No. 737,911, May 28, 1985, abandoned, which is a continuation of Ser. No. 382,812, May 28, 1982, abandoned, which is a continuation of Ser. No. 120,539, Feb. 11, 1980, abandoned, which is a continuation of Ser. No. 946,353, Sep. 27, 1978, abandoned, which is a division of Ser. No. 792,940, May 2, 1977, Pat. No. 4,130,899.

[51] Int. Cl.⁴ .................................. H01L 29/74
[52] U.S. Cl. .................................. 357/38; 357/36; 357/44; 357/46; 307/640; 307/641; 307/645; 307/648; 365/90; 365/180
[58] Field of Search ............ 357/20, 36, 38, 44, 357/46; 307/640, 641, 645, 648; 365/96, 180

[56] References Cited

U.S. PATENT DOCUMENTS

| | | | |
|---|---|---|---|
| 3,213,339 | 10/1965 | Henkels | 357/38 |
| 3,388,009 | 6/1968 | King | 357/91 |
| 3,590,346 | 6/1971 | Bico et al. | 357/38 |
| 3,611,319 | 10/1971 | Hyatt | 365/96 |
| 3,694,669 | 9/1972 | Witt et al. | 307/252 F |
| 3,819,867 | 6/1974 | McCarthy et al. | 357/38 |
| 3,889,161 | 6/1975 | Trush | 307/252 F |
| 3,995,176 | 11/1976 | Sauvanet | 307/252 D |
| 4,015,143 | 3/1977 | Tokunaga et al. | 307/252 A |
| 4,031,413 | 6/1977 | Ohhinata et al. | 365/180 |
| 4,050,083 | 9/1977 | Jaskolski et al. | 357/38 |
| 4,346,308 | 8/1982 | Severson | 307/645 |

OTHER PUBLICATIONS

W. Spofford, "The D13T-A Prog. Uni J. Trans.", G.E. Appl. Note 90.70, Nov. 1967.

Primary Examiner—Joseph E. Clawson, Jr.
Attorney, Agent, or Firm—Skjerven, Morrill, MacPherson, Franklin & Friel

[57] ABSTRACT

This disclosure relates to a programmable write-once, read-only semiconductor memory array which has an improved current source for each bit line and an improved current sink for each Word line. This programmable write-once, read-only semiconductor memory array utilizes a SCR (PNPN or NPNP) on the end of each Word line of the array to function as a current sink to minimize voltage drop on the Word line and a SCR (PNPN or NPNP) on each Bit line of the array for current sourcing purposes. This disclosure also relates to an integrated SCR (PNPN or NPNP) for use with a plurality of connected semiconductor devices to provide either a current sourcing or current sinking or drawing function for the plurality of connected semiconductor devices.

27 Claims, 2 Drawing Sheets

INTEGRATED SCR CURRENT SOURCING SINKING DEVICE

This application is a continuation of application Ser. No. 737,911 filed on May 28, 1985, now abandoned; which is a continuation of application Ser. No. 382,812 filed on May 28, 1982, now abandoned; which is a continuation of Ser. No. 120,539 filed on Feb. 11, 1980, now abandoned; which is a continuation of application Ser. No. 946,353 filed on Sept. 27, 1978, now abandoned; which is a division of application Ser. No. 792,940 filed May 2, 1977, now U.S. Pat. No. 4,130,899.

BACKGROUND OF THE INVENTION

1. Field of the Invention

This invention relates generally to Semiconductor Chips and, more particularly, to Programmable Write-Once, Read-Only Semiconductor Memory Arrays having improved current sourcing and sinking characteristics.

2. Description of the Prior Art

In the past, programmable read-only semiconductor memory arrays (known as PROMS) have been fabricated and sold as important parts of small or larger electronic systems. For example, PROMS have become very popular for use in digital systems such as computer systems, where it was desirable to have a Read-Only memory as part of the system's architecture. Read-Only memory arrays of the programmable type describe a particular class of Read-Only memory that is first selectively programmed or written into to provide a relatively frozen or fixed, customized, Read-Only memory. Read-Only memories are generally made by manufacturers with a fixed custom memory content. However, a problem would develop if a mistake is made, or change of pattern is needed which would require that the Read-Only memory array would have to be redone. This causes delay and a long turn around time. Programmable Read-Only Memory (PROM) eliminates the above problem by allowing the customer to program the memory content. The PROM design is a compromise because the memory array requires large voltage and current to "write" (or program) into a blank chip and the programming circuit often represents a significant portion of the entire memory chip thereby dissipating more power and consuming large chip area. One of the major problems in the programming circuitry is the loss of voltage and current in the programming conductive path thus causing inadequate programming in some portion of the chip. This problem is particularly severe when the memory array is large.

In order to provide chips with only a single layer of metalization, it is necessary to use diffused or implanted N+ or P+ regions as underpass conductors.

The resistance of narrow, long diffused or implanted N+ or P+ regions created severe voltage drop problems for memory cells connected to the end portions of these regions farthest from the driver elements used to apply voltages to these regions. Thus, the memory cells connected at the end of the N+ or P+ regions farthest from the driver elements did not receive the same signal level as the memory cells connected closer to the driver elements.

Another problem associated with prior art PROM devices was the need to provide relatively high voltages to current generating or sourcing devices connected to Word or Bit lines in order to generate enough current to reach the memory cells connected to end portions of the Word or Bit lines with a sufficient current level necessary to perform a writing operation therein. This often required the use of large devices on the chip as well as high power consumption.

Accordingly, a need existed to provide a PROM device or chip that would minimize voltage drop and improve current sourcing.

SUMMARY OF THE INVENTION

It is an object of this invention to provide an improved programmable semiconductor memory array.

It is another object of this invention to provide an improved semiconductor chip having means for providing a current sinking function for a plurality of semiconductor devices connected along a conductive connecting line to the current sinking means to minimize voltage drop along the conducting line or path thereby increasing the current flow on the portion of the conductive connecting line located remote from an applied voltage source.

It is a still further object of this invention to provide a semiconductor chip having improved means for providing current sourcing for a plurality of semiconductor devices connected thereto along a conductive connecting line.

It is a still another object of this invention to provide a semiconductor chip having both means for providing a current drawing or sinking function for a plurality of semiconductor devices connected along a conductive connecting line to the current sinking means to minimize the voltage drop on the portion of the conductive connecting line located remote from an applied voltage source, and improved means for providing current sourcing for a plurality of semiconductor devices connected thereto along a conductive connecting line.

It is a further object of this invention to provide a programmable semiconductor memory array which includes means for providing a current drawing or sinking function for a plurality of semiconductor memory elements connected along a conductive connecting line to the current sinking means to minimize the voltage drop and thereby increase the current flow on the portion of the conductive connecting line located remote from an applied voltage source.

It is a still further object of this invention to provide a programmable semiconductor memory array having improved means for providing current sourcing for a plurality of semiconductor memory elements connected thereto along a conductive connecting line.

It is another object of this invention to provide a programmable semiconductor memory array having both current sinking means to minimize voltage drops on semiconductor conducting lines and improved current sourcing means to supply current to memory cells connected to the improved current sourcing means.

DESCRIPTION OF THE PREFERRED EMBODIMENTS

In accordance with one embodiment of this invention, a programmable semiconductor memory array is disclosed which comprises a plurality of memory cells and a group of Word lines and a group of Bit lines. Each of the memory cells is connected to one of the group of Word lines and one of the group of Bit lines. Each of the memory cells has a first electrical state prior to receiving a writing signal and a different second electrical state after receiving a writing signal. Silicon controlled rectifier (SCR) means is connected to each one of the group of Word lines and the group of Bit lines to provide one of the functions of drawing current from and sourcing current to the memory cells connected to the silicon controlled rectifier means.

In accordance with another embodiment of this invention, a semiconductor chip is disclosed which comprises an integrated, current drawing silicon controlled rectifier (SCR) device and a plurality of semiconductor devices connected together and to the integrated current drawing SCR device. The connection from the plurality of semiconductor devices to the integrated current drawing SCR device is located intermediate the first and last active regions of the integrated current drawing SCR device. Preferably, an integrated current sourcing SCR device is also included in the semiconductor chip which is connected to each of a plurality of semiconductor devices that are connected together. The connection from the plurality of semiconductor devices to the integrated current sourcing SCR device is to one of the first and last active regions of the integrated current sourcing SCR device.

The foregoing and other objects, features and advantages of the invention will be apparent from the following more particular description of the preferred embodiments of the invention as illustrated in the accompanying drawing.

BRIEF DESCRIPTION OF THE DRAWING

FIG. 3 is the SCR (PNPN) device of FIG. 2 as it is laid out in the semiconductor chip of FIG. 1 showing the active regions of the device and the conducting metal and diffused lines connected to the PNPN device.

THE SPECIFICATION

Figure 1:
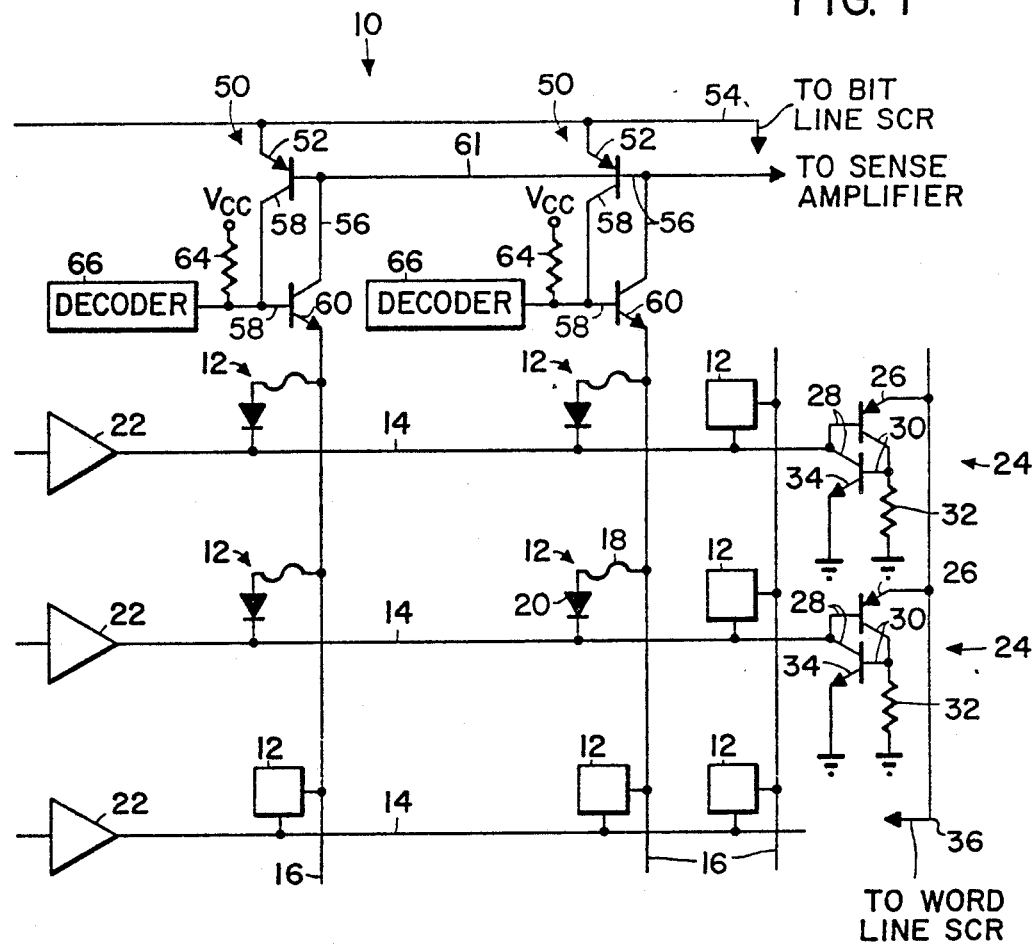
FIG. 1 is a schematic representation of a PROM array semiconductor chip showing an SCR (PNPN) device connected to a Word line to reduce voltage drop on that line and an SCR (PNPN) device connected to a Bit line for current sourcing purposes.
Figure 2:
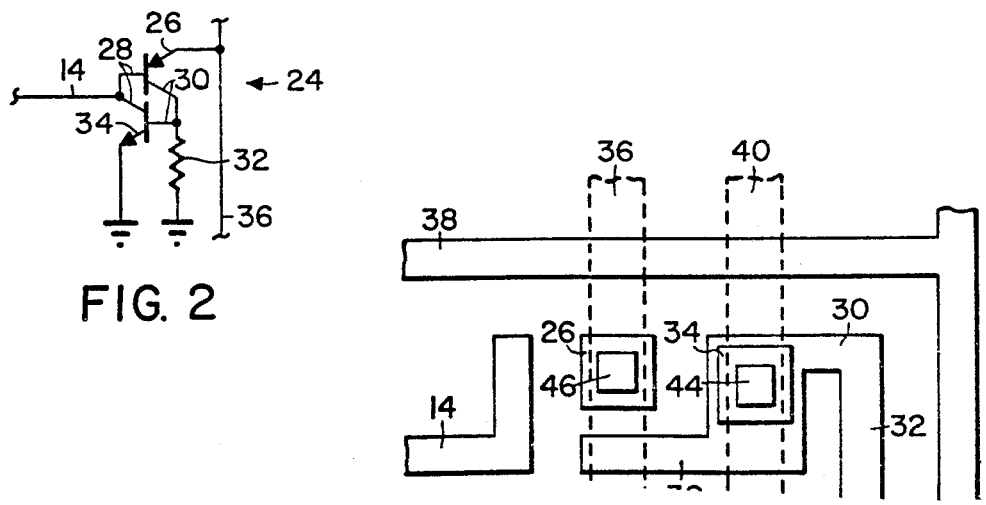
FIG. 2 is a more detailed, enlarged schematic view of the SCR (PNPN) device connected to a Word line as used in FIG. 1.

Referring to FIG. 1, a semiconductor chip is generally designated by reference numeral 10. The semiconductor chip 10 is used as a PROM of the Write-Once, Read-Only type wherein writing signals are used to write information into memory cells or elements 12 (only four of which are shown in detail) forming part of the semiconductor chip 10. Attached to each of the memory cells 12 is a N+ diffused Word line 14 and an overlying metal Bit line 16. The N+ diffused Word line 14 is more clearly shown and described with reference to FIGS. 2 and 3. The metal Bit line 16 is shown as one of the metal Bit lines of FIGS. 4 and 5.

The memory cell 12 shown in detail in FIG. 1 is simply a fuse element 18 connected to a semiconductor diode 20. Other well known memory cell structures of the Write-Once, Read-Only type can be used, if desired, in place of the specific memory cell design 12 shown in FIG. 1. Similarly, it is even possible to use memory cells, if desired, whose memory states are not permanently changed during the writing operation, but are alterable.

A Word line driver 22 is connected to one end of each N+ diffused Word line 14 and drives the selected word to a low voltage level (typically 0.3 volt). At the other end of the Word line 14, is a Word line SCR device 24. The specific details of the operation of the Word line SCR device 24 is described more fully below. The Word line SCR device 24 has a P diffused region 26 (see FIG. 3) which is the first P region of the PNPN device 24. Preferably, this P region 26 is formed during a base type diffusion operation in performing the usual type of base type diffusion operation that is employed to make a conventional bipolar NPN transistor device that is used in, for example, the Word line driver 22 and/or in the Decoder connected to each Bit line 16. A N epitaxial region 28 (see FIG. 3) is the first N region of the PNPN device 24. Preferably, this N region 28 is formed during the process of forming the collector region of a conventional bipolar NPN transistor device. The N region 28 functions as both the base region of the PNP transistor portion of the PNPN device 24 as well as the collector region of the NPN transistor portion of the PNPN device 24. A second P region 30 of the PNPN device 24 serves as both the collector region of the PNP transistor portion of the PNPN device 24 as well as the base region of the NPN transistor portion of the PNPN device 24. This second P region 30 is formed the same way and at the same time as the P region 26. As shown, a P type diffused resistor 32 is connected between the P region 30 and ground. A second N region 34 of the PNPN device 24 serves as the emitter region of the NPN transistor portion of the PNPN device 24 and is preferably formed during the process of forming N+ emitter regions for conventional NPN bipolar transistors. As shown, the second N region 34 is connected to ground. As can be seen with reference to FIGS. 1, 2 and 3, the Word line 14 is connected to the N region 28 of the PNPN device 24 and the current drawing or current sinking function and operation of the thus connected arrangement between the PNPN device 24 and its connected Word line 14 is described below. The first P region 26 or the emitter of the PNP transistor portion of the PNPN device 24 is connected by metal line 36 to the other first P regions (not shown) of other PNPN devices (not shown) connected to other Word lines (not shown) of the semiconductor chip 10.

With reference to FIG. 3, the PNPN device 24 is located in an isolation moat formed by a P+ diffused region 38 which surrounds the N epi region 28 that serves as both the base of the PNP transistor portion and the collector of the NPN transistor portion of the PNPN device 24. A metal ground contact line 40 serves to connect up all the isolation diffused regions 38 of each isolation moat that contains a Word line and an SCR device, each of the resistors 32 connected to the P region 30 of each SCR device 24, and all the N regions 34 of each SCR device connected to each of the other Word lines of the memory array (not shown). As shown in FIG. 3, a metal contact 42 is formed (through an insulating layer of, for example, silicon dioxide (not shown) to make electrical contact to both the P+ isolation region 38 and, because of the overlapping diffused region portion where this contact 42 is made, to the resistor 32. Due to an electrical metal contact 44 (which is similar to the metal contact 42) to the N+ region 34, the ground line 40 is also connected to this N+ region 34. While reference is made to metal lines at various points in this description, it should be understood that, while metal lines such as aluminum is generally contemplated, other types of highly conductive lines can be used and are, accordingly, included within the expression or term "metal" lines. For example, doped polysilicon lines are also included within the expression metal lines.

The metal line 36 is connected to the first P region 26 by means of metal contact 46 that is made, similar to the metal contacts 42 and 44, to the underlying diffused P region 26 located beneath the metal line 36 which crosses, as does the metal ground line 40, over the PNPN device 24 in its isolation region 38 to pick up the other PNPN devices (not shown). As shown in FIG. 3, the Word line 14 is the N+ diffused conductive line that extends along and within the N epi region 28. This N+ Word line 14 is formed by an emitter type diffusion at the same time as the formation of the N+ emitter region 34 of the NPN transistor portion of the PNPN device 24. Because of its location in the N epi region 28, the N+ Word line 14 is electrically tied to the N epi region 28 of the PNPN device 24. Other Word lines (not shown) are similarly tied to the N regions 28 of other PNPN devices (not shown) in the semiconductor chip 10.

Figure 4:
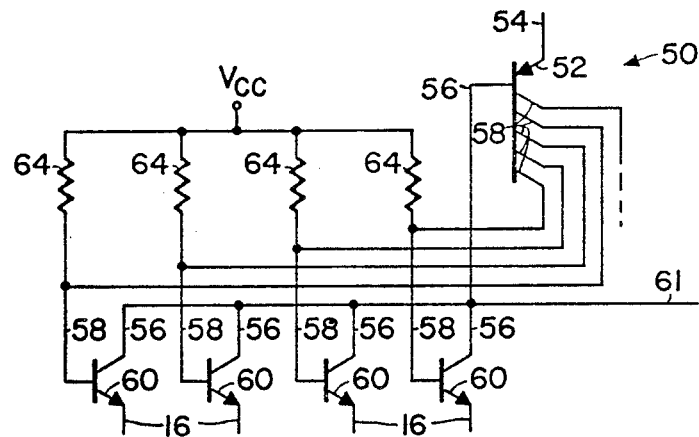
FIG. 4 is a view somewhat similar to FIG. 2; however, showing several SCR (PNPN) devices connected to several Bit lines as used in FIG. 1.
Figure 5:
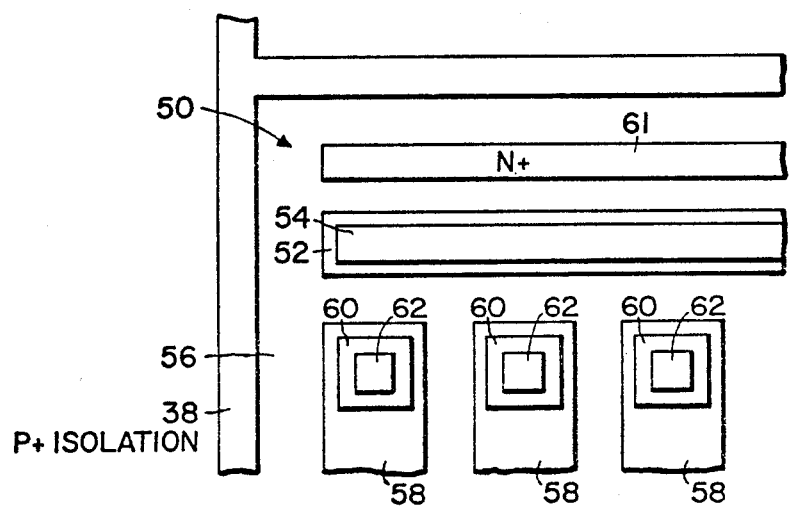
FIG. 5 is a view somewhat similar to FIG. 3 showing, however, a top view of the SCR (PNPN) device of FIG. 4 as they are laid out in the semiconductor chip of FIG. 1 illustrating the active regions of the devices and the conductive metal lines connected to Bit lines and to other PNPN devices.

With reference to FIGS. 1, 4 and 5, each metal Bit line 16 extends on an insulation layer, such as silicon dioxide, (not shown) over the Word lines 14 of the PROM semiconductor chip 10. Thus, this substantially orthogonal arrangement of Word and Bit lines serves to electrically connect up the Word and Bit lines to the memory elements 12 of the PROM semiconductor chip 10. The semiconductor diodes 20 are formed in the semiconductor portion of the semiconductor chip 10 by conventional diffusion or ion implantation techniques during the process of forming the semiconductor regions of the other semiconductor devices located in the semiconductor chip 10. The Nichrome fuses 18 are preferably formed on the insulating layer by a metal evaporation or deposition process followed by a metal etching operation for the desired patterning. A Bit line SCR (PNPN) device 50 is shown connected to each metal Bit line 16. With reference to FIG. 1, each Bit line 16 has one SCR (PNPN) device 50 (shown for simplicity of illustration), but in FIG. 4 a number of Bit lines 16 are connected individually to a single NPN portion of what is effectively one of a number of SCR (PNPN) devices having multiple NPN portions and a single PNP portion with multiple collector leads.

The Bit line SCR device 50 has a first P region 52 which is electrically connected to a metal line 54 (see FIGS. 1 and 5) that is electrically connected to the other similar P regions of the other Bit line SCR devices. This P region 52 is a base type P diffused or implanted region formed during the process of making the base region of an NPN bipolar transistor. A first N region 56 serves as the base region of the PNP transistor portion of the Bit line SCR device 50 as well as the collector region of the NPN transistor portion of the Bit line SCR device 50. This N region 56 is preferably the N epi collector region of an NPN bipolar transistor device. A second P region 58 (formed in the same manner as the first P region 52) functions as the collector region of the PNP transistor portion of the PNPN device 50 as well as the base region of the NPN transistor portion of the PNPN device 50. An N+ region 60 functions as the emitter region of the NPN transistor portion of the Bit line PNPN device 50. This N+ region 60 is formed during an emitter type diffusion operation in the process of forming a conventional NPN bipolar transistor. Each N+ region 60 is connected by a metal contact 62 (see FIG. 5) to the metal Bit line 16 (not shown in FIG. 5, but see FIGS. 1 and 4). N+ diffused region 61 (formed like the N+ emitter type regions 60) in FIG. 5 functions as a high conductivity (or low resistance) conductor region for the N epitaxial region 56 which serves as the base region of the PNP transistor portion (see FIG. 4) as well as the collector regions of each NPN transistor portion (see FIG. 4). The PNPN device 50 shown in FIG. 1 is a simpler device arrangement than the number of PNPN devices shown in FIGS. 4 and 5 which utilize one PNP transistor portion to effectively form a plurality of PNPN devices by being connected up to a plurality of NPN transistor portions as shown in FIGS. 4 and 5. Thus, the PNP transistor portion of the PNPN arrangement shown in FIGS. 4 and 5 has the single P emitter region 52 and an N base region 56 connected and formed as shown in FIGS. 4 and 5 to the N collector regions of the plurality of NPN transistor portions. Similarly, each one of a plurality of P collector contacts 58 to the single PNP transistor portion are connected to each one of a plurality of P base regions of the plurality of NPN transistor portions. Thus, in this arrangement as shown in FIGS. 4 and 5, a single PNP transistor portion with a plurality of collector contacts and a base connected up as shown in FIGS. 4 and 5 can, together with a plurality of NPN transistor portions, provide a plurality of PNPN devices 50 connected up to a plurality of Metal Bit lines 16 to serve the current sourcing function described below.

Each of the P regions 58 has a resistor 64 (see FIGS. 1 and 4) which is connected to each diffused P region 58. The resistor 64 is not shown in FIG. 5. A Decoder 66 (see FIG. 1) is connected to the P region 58 of the base of the NPN transistor portion of the PNPN device 50 and to the resistor 64. The function of this Decoder 66, which serves to select a Bit line, is more fully described below together with the function of the resistor 64. If desired a Sense Amplifier, for memory cell sensing or reading purposes is connected to the N+ region 61. The Sense Amplifier functions to sense current in the Bit lines 16 during normal Read operations to determine the state of a Logic "1" or a Logic "0" in the memory cell that is being sensed or read.

SCR WORD LINE SINKING CURRENT OPERATION

The operation of the SCR Word line current sinking or current drawing function is important to provide a means for minimizing voltage drops down the Word lines at a location distant from the voltage source that is applied to one end of each Word line during, for example, a Write operation. In a Write operation, a particular memory cell is selected using its connection to the Word line associated with the memory cell and the Bit line also associated with the same memory cell. A Logic "1", (or "0", depending on circuit design) for example, is written into the selected memory cell by applying sufficient current generally on the order of about 20 miliamps through the Nichrome fuse (which is generally only about 150 Angstroms thick) and a sufficient voltage differential (usually at least about 10 Volts) to opposite ends of the Nichrome fuse to blow the Nichrome fuse. Thus, with the Nichrome fuse blown, an "open" is created which prevents current from going through the memory cell which includes the Nichrome fuse connected to one plate of a semiconductor diode. Therefore, in an "open" position, the lack of current flowing through the memory cell is sensed by the Sense Amplifier connected to the Bit line and a Logic "1" is thereby associated with the "open" memory cell and a Logic "0" is correspondingly associated with a current conducting memory cell. If desired for convenience of designation, an "open" memory cell can indicate a Logic "0" with a conducting memory cell representing a Logic "1".

In order to preserve a single metalization PROM structure, it is necessary to have either the Word lines or the orthogonal Bit lines be a diffused, high conductivity (N+ or P+) region running across the semiconductor chip picking up, by connection, all of the memory cells associated with the diffused Word or Bit line. If, for example, as is shown herein, the Word lines are selected to be diffused semiconductor lines, then the Bit lines are metal lines patterned or formed on an insulating layer located on one surface of the semiconductor chip over the diffused Word lines.

Due to the fact that the Word lines are diffused semiconductor lines, there is this very severe voltage drop that occurs because of the resistance of the diffused semiconductor Word lines. Thus, prior PROM devices faced with this problem tried to solve it in two different ways, both of which were undesirable. One way to solve this severe voltage drop problem was to reduce the resistance of the diffused semiconductor Word lines which could be accomplished by making the diffused semiconductor lines much wider thereby lowering the resistance thereof, however, this solution to the severe voltage drop problem was undesirable because it consumed a great deal of valuable semiconductor (silicon) real estate thereby creating memory cell density limitations. The other way that was tried to solve this severe voltage drop problem was to use higher voltages at the front ends of the Word lines in order to compensate for the severe voltage drop down the Word lines and to provide sufficient voltage levels for the memory cells located toward the end portions of the Word lines. However, this solution was also undesirable due to the problem that the unselected fuses of the memory cells located at the front ends of the Word lines become erroneously blown because of the use of higher voltages at the front ends even when the particular fuse is not selected. Furthermore, the need for higher voltage on a semiconductor device creates yield problems.

Accordingly, there was a definite need to prevent this severe voltage drop from occurring between the opposite ends of the Word lines, especially where circuit design specifications dictated that the voltage source at the front end of the Word lines was only to be typically 0.3 Volts as is the situation for the PROM disclosed herein. This severe voltage drop problem was solved by the use of the SCR or PNPN device connected, as shown, to the other end of each Word line (the opposite end from where the Word driver supplies its 0.3 Volt potential). As shown, the PNPN device, which can also be considered as the combination of a PNP transistor with an NPN transistor, as illustrated, is connected to each Word line at the portion of the PNPN device which is the base portion of the PNP transistor and which also serves as the collector portion of the NPN transistor. This SCR or PNPN device turns on, when the particular Word line is selected, upon receipt of a current as small as 0.1 miliamps from the selected Word line. Initially, upon being turned on, current first comes out of the N region of the PNP transistor (or N collector region of the NPN transistor) portion of the SCR or PNPN device. This occurs for a very short period of time. Then, the SCR or PNPN device becomes self-sustaining, goes into saturation and functions to pull current out of the selected Word line and thereby develop a very small voltage at the portion of the selected Word line adjacent to the SCR or PNPN device. Thus, the SCR or PNPN device creates a voltage of about 0.3 Volts on the selected Word line at the portion thereof opposite the Word line driver and hence, permits the memory cells connected to both end portions of the selected Word line to receive the same 0.3 Volt source. Therefore, due to the current sinking function or means displayed by the SCR or PNPN device, the severe voltage drop across both end portions of a Word line is avoided by means of the use of a single PNPN device without the necessity of providing separate word line drivers at both ends of the Word line, which is very costly in terms of actual manufacturing cost and power required to operate the line drivers.

SCR BIT LINE SOURCING CURRENT OPERATION

In order to blow a Nichrome fuse in a selected memory cell to write a Logic "1" (or Logic "0"), it is imperative that the memory cell receive the combination of a sufficient voltage differential between the Word line and the Bit line (at least about 10 Volts) and a minimum current level through the selected memory cell (at least about 20 miliamps) from its connected Bit and Word lines to blow the Nichrome fuse. As described above, the use of the SCR or PNPN device in the selected Word line at the opposite end of the Word line from the Word line driver serves to supply the required low voltage (typically 0.3 Volts) needed at the opposite end of the Word line to blow the Nichrome fuse of a selected memory cell provided that there is a sufficient voltage differential (at least about 10 Volts) across the Nichrome fuse and a sufficient amount of current (at least about 20 miliamps) flowing through the memory cell from the Bit and Word line connected to the selected memory cell.

Since the Bit lines used in this memory array are metal lines, the voltage drop problem that is associated with the diffused Word lines is not encountered with the use of the metal Bit lines. However, the problem has been to provide a device to supply enough current at one end of each selected Bit line to generate, for the example shown herein, 20 miliamps of current for the selected Bit line. Prior attempts to do this have not been very successful. The use of an NPN (or PNP) transistor connected to the Bit line did not generate this amount of current without the requirement of (a) using a very high voltage for the NPN (or PNP) device, (b) transistors with large current gain, and (c) high power consumption.

Accordingly, there was a need to solve this problem so that a sufficient amount of current (at least about 20 miliamps) could be generated with a maximum voltage of about 16 to 18 Volts.

With reference to the drawings, the SCR or PNPN device that is connected to each Bit line functions to provide the necessary 20 miliamps of current (and a voltage greater than 10 Volts) for the selected Bit line. Thus, in selecting a memory cell, the particular Word line and Bit line connected to the selected memory cell are both energized to drive the amount of current (20 miliamps) necessary to blow the fuse of the selected memory cell and write a Logic "1" (or Logic "0") and the two SCR devices connected to the Word and Bit lines function as described above to permit this fuse blowing operation. The PNPN device connected to each Bit line is arranged as a combined PNP transistor connected to an NPN transistor with the base of the PNP transistor serving as the collector of the NPN transistor and the base of the NPN transistor serving as the collector of the PNP transistor.

As shown in the drawings, the emitter of the NPN transistor portion of each PNPN device is connected to a Bit line by means of the metal contact form the metal Bit line to the N+ diffused emitter region of the NPN transistor portion of the PNPN device. The resistor 64 (14,000 $\Omega$) which is connected to the chip power supply (5 Volts) or $V_{CC}$ line functions to supply a small amount of current (about 0.5 miliamps) to the P diffused base region of the NPN transistor portion of the PNPN device to turn on the PNPN device. However, this only occurs for a selected Bit line when the decoder connected to the P diffused base portion of the NPN transistor portion of the PNPN device is selected which then permits current to flow from the 14,000 ohm resistor 64 directly into the P diffused base region of the NPN transistor portion of the PNPN device. If this decoder is not selected, then current flowing from the 14,000 ohm resistor device 64 is shunted or switched into the decoder which basically functions as a selection switch means to either permit current to flow from the 14,000 ohm resistor device 64 into the base of the NPN transistor portion of the PNPN device to turn it on or prevents current from flowing from the 14,000 ohm resistor device 64 into the base of the NPN transistor portion of the PNPN device to keep it turned off. Thus, with a voltage of about 16 to 18 volts on the emitter portion of the PNP transistor portion of each PNPN device (since all the P emitters of the PNP transistor portions of the PNPN devices are tied together to the metal line 54 that is also connected to a power supply (not shown) that supplies the 16 to 18 volts, the non selected decoders 66 attached to the P diffused base regions of each NPN transistor portion of each of the PNPN devices that are not turned on draws the current coming from the 14,000 ohm resistors. Therefore, the non-selected decoders pull the voltage low on the P diffused base of the NPN transistor portion of the unselected PNPN devices to about 1 Volt whereas if the decoder is selected then the voltage goes higher on the base of the NPN transistor portion to turn on the PNPN device.

During normal operation, all the SCR or PNPN devices are biased off and will not affect the normal function of the device. The selected Word and Bit lines attached to the Word and Bit lines are energized during the Write "1" operation into the memory cell associated with the selected Word and Bit lines and the PNPN devices attached to the selected Word and Bit lines are activated as described above. The number of Word and Bit lines can be varied as desired and can be from 1 to 64 lines for each Word and Bit line. Thus, in designing a 4,096 (4K) bit PROM, 64 Word lines and 64 Bit lines are used.

What is claimed is:

1. A semiconductor integrated circuit comprising:
  a semiconductor body;
  a first plurality of silicon controlled rectifiers formed in the body for sourcing current;
  a second plurality of silicon controlled rectifiers formed in the body for sinking current; and
  connecting means for providing one electrical connection between each of the sourcing rectifiers and each of the sinking rectifiers.
2. An integrated circuit as in claim 1, wherein the connecting means includes:
  a first plurality of semiconductor linear regions formed in the body, each one of the semiconductor linear regions being electrically connected to a different one of the sinking rectifiers;
  a second plurality of conductive metal lines formed on a surface of the body, each one of the metal lines being electrically connected to a different one of the sourcing rectifiers; and
  one electrical connection between each of the semiconductor linear regions and each of the metal lines.
3. An integrated circuit as in claim 2, wherein each of the metal lines is orthogonal to each of the semiconductor linear regions.
4. An integrated circuit as in claim 2, wherein each of the rectifiers includes a plurality of adjacent semiconductor regions.
5. An integrated circuit as in claim 4, wherein:
  at least one region of each of the sourcing rectifiers is electrically connected to a common voltage source; and
  at least one region of each of the sinking rectifiers is electrically connected to ground.
6. An integrated circuit as in claim 5, further comprising a voltage source electrically connected to an end of each of the linear semiconductor regions opposite an end connected to one of the sinking rectifiers.
7. An integrated circuit as in claim 5, wherein each of the sourcing rectifiers includes:
  a first semiconductor region of a first conductivity type electrically connected to the common voltage source;
  a second semiconductor region of a second conductivity type opposite the first conductivity type;
  a third semiconductor region of the first conductivity type; and
  a fourth semiconductor region of the second conductivity type electrically connected to the metal line.
8. An integrated circuit as in claim 5, wherein each of the sinking rectifiers includes:
  a first semiconductor region of the first conductivity type;
  a second semiconductor region of the second conductivity type electrically connected to the linear semiconductor region;
  a third semiconductor region of the first conductivity type electrically connected to ground by means of a resistance; and
  a fourth semiconductor region of the second conductivity type electrically connected to ground.
9. An integrated circuit as in claim 8, further comprising a common electrical connection between the first semiconductor regions of each of the sinking rectifiers.
10. An integrated circuit as in claim 7, wherein:
  the first, second, and third semiconductor region are a first transistor, the second region being the base and the third region being the collector of the first transistor; and the second, third, and fourth semiconductor region are a second transistor, the second region being the collector and the third region being the base of the second transistor.

11. An integrated circuit as in claim 8, wherein:

the first, second, and third semiconductor regions are a first transistor, the second region being the base and the third region being the collector of the first transistor; and the second, third, and fourth semiconductor regions are a second transistor, the second region being the collector and the third region being the base of the second transistor.

12. An integrated circuit as in claim 1, further comprising means for selectively but simultaneously firing one of the sinking rectifiers and one of the sourcing rectifiers.

13. A semiconductor node array comprising, in combination, a plurality of nodes interconnected to provide a node array, and a group of first lines and a group of second lines, each of said nodes being connected to one of said group of first lines and one of said group of second lines, and silicon controlled rectifier means connected to each line of said group of first lines and to each line of said group of second lines to provide the functions of drawing current from said group of first lines and sourcing current to said group of second lines and to the nodes connected to said silicon controlled rectifier means, said silicon controlled rectifier means connected to each line of said group of first lines being located at the opposite end of the first line from a voltage source.

14. A semiconductor node array in accordance with claim 13 wherein said group of first lines being high conductivity semiconductor lines, said group of second lines being metal lines overlying said high conductivity semiconductor lines.

15. A semiconductor node array in accordance with claim 14 wherein said silicon controlled rectifier means comprises a PNPN device.

16. A semiconductor node array in accordance with claim 15 wherein said PNPN device comprises a PNP transistor portion connected to a NPN transistor portion and having the base of said PNP transistor portion being the collector of said NPN transistor portion with the collector of said PNP transistor portion being the base of said NPN transistor portion, said emitter of said NPN transistor portion being connected to one of said group of metal second lines.

17. A semiconductor node array in accordance with claim 13 wherein said silicon controlled rectifier means comprises a PNPN device.

18. A semiconductor node array in accordance with claim 17 wherein said PNPN device comprising a PNP transistor portion connected to a NPN transistor portion and having the base of said PNP transistor portion being the collector of said NPN transistor portion with the collector of said PNP transistor portion being the base of said NPN transistor portion, said base of said PNP transistor portion and said collector of said NPN transistor portion of said PNPN device being connected to one of said group of first lines.

19. A semiconductor node array in accordance with claim 18 wherein each said emitter of said PNP transistor portion of each said PNPN device connected to each of said first lines being connected together by a common metal line, said base of said NPN transistor portion and said collector of said PNP transistor portion of each first line PNPN device being connected to ground, said emitter of said NPN transistor portion of each first line PNPN device being connected to ground.

20. A semiconductor node array in accordance with claim 19 wherein said emitter of said PNP transistor portion and said base of said NPN transistor portion of each said PNPN device connected to each of said first lines being a diffused base type region of NPN bipolar transistor, said base of said PNP transistor portion and said collector of said NPN transistor portion of each said PNPN device connected to each of said first lines being an epitaxial collector type region of a NPN transistor portion of each said PNPN device connected to each of said first lines being an emitter type diffused region of a NPN bipolar transistor.

21. A semiconductor node array in accordance with claim 20 wherein said first lines comprises an emitter type diffused region of a NPN bipolar transistor located in said epitaxial collector type region.

22. A semiconductor node array in accordance with claim 17 wherein said PNPN device comprises a PNP transistor portion connected to a NPN transistor portion and having the base of said PNP transistor portion being the collector of said NPN transistor portion with the collector of said PNP transistor portion being the base of said NPN transistor portion, said emitter of said NPN transistor portion being connected to one of said group of second lines.

23. A semiconductor node array in accordance with claim 22 wherein said emitter of said PNP transistor portion of said PNPN device connected to each of said second lines being connected together by a common metal line, said base of one PNP transistor portion of each said second line PNPN device being connected to the collector regions of the NPN transistor portions of a plurality of PNPN devices individually connected to a plurality of said second lines, said collector of said one PNP transistor portion being connected to base regions of said plurality of PNPN devices, said base and collector regions of said one PNP transistor portion being shared with a plurality of NPN transistor portions to provide said plurality of PNPN devices.

24. A semiconductor node array in accordance with claim 23 wherein said emitters of said PNP transistor portions and said bases of said NPN transistor portions of said plurality of PNPN devices connected to said plurality of second lines being a diffused base type region of a NPN bipolar transistor, said bases of said PNP transistor portions and said collectors of said NPN transistor portions of each of said plurality of PNPN devices connected to said plurality of second lines being an epitaxial collector type region of a NPN bipolar transistor, said emitter region of said NPN transistor portions of each of said plurality of PNPN devices connected to said plurality of second lines being an emitter type diffused region of a NPN bipolar transistor.

25. A semiconductor node array in accordance with claim 24 wherein said second lines comprise metal lines, each of said metal second lines being connected to said emitters of said NPN transistor portions of said plurality of PNPN devices connected to said plurality of second lines.

26. A semiconductor node array in accordance with claim 22 wherein said PNPN device of said silicon controlled rectifier means connected to each line of said first lines comprises a PNP transistor portion connected to a NPN transistor portion and having the base of said PNP transistor portion being the collector of said NPN transistor portion with the base of said NPN transistor portion, said base of said PNP transistor portion and said collector of said NPN transistor portion of said PNPN device being connected to one of said group of first lines.

27. A semiconductor node array in accordance with claim 13, further comprising means for selectively but simultaneously firing one of the silicon controlled rectifier means connected to said group of first lines and one of the silicon controlled rectifier means connected to said group of second lines.

* * * * *